United States Patent [19]
Azumai

[11] Patent Number: 5,541,505
[45] Date of Patent: Jul. 30, 1996

[54] TESTING INTEGRATED CIRCUITS BY CONSOLIDATING A PLURALITY OF DIGITAL SIGNALS AS A MULTILEVEL SIGNAL

[75] Inventor: Hideo Azumai, Toyonaka, Japan

[73] Assignee: Mega Chips Corporation, Osaka, Japan

[21] Appl. No.: 121,102

[22] Filed: Sep. 14, 1993

Related U.S. Application Data

[63] Continuation-in-part of Ser. No. 38,820, Mar. 29, 1993, abandoned, which is a continuation of Ser. No. 731,975, Jul. 18, 1991, Pat. No. 5,198,757.

[30] Foreign Application Priority Data

May 15, 1991 [JP] Japan ................................. 3-141101

[51] Int. Cl.$^6$ ................................................. G01R 31/00
[52] U.S. Cl. ..................... 324/158.1; 324/73.1; 371/21.1
[58] Field of Search ............................... 324/158.1, 73.1, 324/765; 371/22.1, 27, 15.1, 22.6, 22.4, 22.3; 340/825.79

[56] References Cited

U.S. PATENT DOCUMENTS 4,749,947  6/1988  Gheewala .
4,975,640  12/1990  Lipp .
5,065,090  11/1991  Gheewala .
5,202,624  4/1993  Gheewala .

FOREIGN PATENT DOCUMENTS 1-179338  7/1989  Japan .

*Primary Examiner*—Vinh P. Nguyen
*Attorney, Agent, or Firm*—Frishauf, Holtz, Goodman, Langer & Chick, P.C.

[57] ABSTRACT

An apparatus for testing a semiconductor integrated circuit includes a plurality of probe lines and a plurality of sense lines which intersect each other to thereby define a plurality of intersections thereby as electrically isolated from each other. An electronic switch device is provided for each intersection for producing a multilevel signal, on an associated sense line, having one of a predetermined number of voltage levels corresponding to various combinations definable by a predetermined number of binary numbers supplied to test points from logic elements to be tested.

In a four test point embodiment, four test points are arranged such that each test point is located in a corresponding one of four quadrants defined by a pair of probe and sense lines intersecting each other. Preferably, the integrated circuit is in the form of a gate array.

21 Claims, 14 Drawing Sheets

TESTING INTEGRATED CIRCUITS BY CONSOLIDATING A PLURALITY OF DIGITAL SIGNALS AS A MULTILEVEL SIGNAL

RELATED APPLICATIONS

This application is a Continuation In Part of U.S. Ser. No. 08/038,820 filed Mar. 29, 1993 (now abandoned) which is a continuation of U.S. Ser. No. 07/731,975 filed Jul. 18, 1991, now U.S. Pat. No. 5,198,757 issued Mar. 30, 1993.

BACKGROUND OF THE INVENTION

1. Field of the Invention

This invention generally relates to an apparatus and a method for testing a semiconductor integrated circuit, and, more particularly, to a technique for testing an integrated circuit using probe lines and sense lines, which are incorporated in the integrated circuit so as to intersect (but be electrically separated from) each other.

In general, the known Scan-Path method and the Cross-Check method have been used to test whether a large number of logic elements (e.g., logic gates) incorporated in an integrated circuit function properly or not.

In the Scan-Path method, test pattern signals are applied in sequence to an integrated circuit, and then output pattern signals from the integrated circuit are monitored to detect faulty logic elements.

Recently, the number of logic elements incorporated in integrated circuits has been increasing rapidly due to the continuing progress of integration technology, so that the testing cost of the Scan-Path method has become expensive because testing requires a long time and much labor. In addition, this method requires a large number of flip-flops to be incorporated in the integrated circuit.

U.S. Pat. No. 4,749,947, discloses a technique for testing an integrated circuit by the Cross-Check method. In this testing technique, as shown here in FIG. 15 as an example, a large number of probe lines $P_i$, $P_{i+1}$, $P_{i+2}$, each of which corresponds to each row of an array of logic elements such as NAND, NOR, INVERTER, and D-type FLIP-FLOP, and a large number of sense lines $S_j$, $S_{j+1}$, $S_{j+2}$, each of which corresponds to each column of an array of logic elements, are incorporated in an integrated circuit so as to intersect at right angles, and each logic element is disposed so as to correspond to one of the intersections where the probe lines $P_i$, $P_{i+1}$, $P_{i+2}$ and the sense lines $S_j$, $S_{j+1}$, $S_{j+2}$ intersect each other.

A test point TP of each logic element is connected to its corresponding sense line through an electronic or detector switch EQ consisting of a MOSFET, and each detector switch EQ is turned on by applying a selection signal to the corresponding probe line. Therefore, in accordance with the teachings of the above-identified patent, there is provided only one test point TP at each of the intersections between the probe lines P and sense lines S.

For example, with one of a plurality of test pattern signals being applied to the integrated circuit by applying a selection signal of binary state "1" to the probe line $P_i$, the detector switches EQ connected to the probe line $P_i$ are turned on, and then test signals at the test points TP of one logic element are fed to the sense lines $S_j$, $S_{j+1}$, $S_{j+2}$, respectively. Then, by applying the selection signal to the next probe line $P_{i+1}$, test signals at the test points TP of NOR, D-type Flip-Flop, etc., are fed to the sense lines $S_j$, $S_{j+1}$, $S_{j+2}$, respectively. In this manner, by applying the selection signal to the probe lines in sequence, all logic elements are tested with regard to the applied one of the plurality of test pattern signals. Then, another test pattern signal is applied to the integrated circuit, and the same steps as above described are carried out, and by applying all the test pattern signals in sequence to the integrated circuit, all logic elements are tested with regard to all test pattern signals.

It is to be noted, however, that the above-described testing technique requires a large number of probe and sense lines to be incorporated in an integrated circuit so that each of the test points corresponds to one of the intersections between the probe and sense lines. In other words, if a matrix structure of logic elements, or a matrix structure of test points, consists of X number of rows and Y number of columns, it is required to incorporate X number of probe lines and Y number of sense lines altogether in an integrated circuit. In order to incorporate such a large number of probe and sense lines, the integration density of an integrated circuit has to be undesirably reduced; therefore, a testing apparatus according to this testing technique can be neither practical nor economical.

SUMMARY OF THE INVENTION

In accordance with the present invention, there is provided an apparatus and a method for testing a semiconductor integrated circuit, including a plurality of probe lines and a plurality of sense lines which intersect each other to thereby define a plurality of intersections between the probe and sense lines which, however, are electrically isolated from each other.

Also provided is a means for producing a multilevel signal on an associated sense line for each of said plurality of intersections. In one embodiment, this producing means includes a pair of detector switches, each of which is connected to a corresponding test point for connection to a logic element to be tested. The detector switches are selectively connected to an associated sense line by selector means operatively connected to an associated probe line. Thus, when a selection signal is supplied, the selector means is activated to have the detector switches operatively connected to said associated sense line. Preferably, each of the detector switches and selector means is comprised of a MOSFET.

Preferably, the probe and sense lines extend orthogonally to each other to thereby define four quadrants around each of the intersections and there are provided four test points for each of the intersections such that each of the four test points is arranged in a corresponding one of these four quadrants symmetrically. In the case where four test points are provided for each of the intersections, there can be produced a multilevel signal having one of a maximum of sixteen different voltage levels.

In another embodiment of the present invention, the semiconductor integrated circuit is in the form of a gate array.

It is therefore a primary object of the present invention to provide an improved apparatus and a method for testing a semiconductor integrated circuit capable of producing a multilevel signal having one of a predetermined number of voltage levels.

Another object of the present invention is to provide an improved apparatus and a method for testing a semiconductor integrated circuit having a reduced space requirement.

A further object of the present invention is to provide an improved apparatus and a method for testing a semiconductor integrated circuit capable of carrying out a testing operation more quickly.

A further object of the present invention is to provide an improved apparatus and a method for testing a semiconductor integrated circuit having an increased flexibility in testing.

Other objects, advantages and novel features of the present invention will become apparent from the following detailed description of the invention when considered in conjunction with the accompanying drawings.

DESCRIPTION OF THE PREFERRED EMBODIMENTS

An apparatus for testing a semiconductor integrated circuit according to an embodiment of the present invention when applied to a general purpose semiconductor integrated circuit is shown in FIGS. 1–5.

Figure 1:
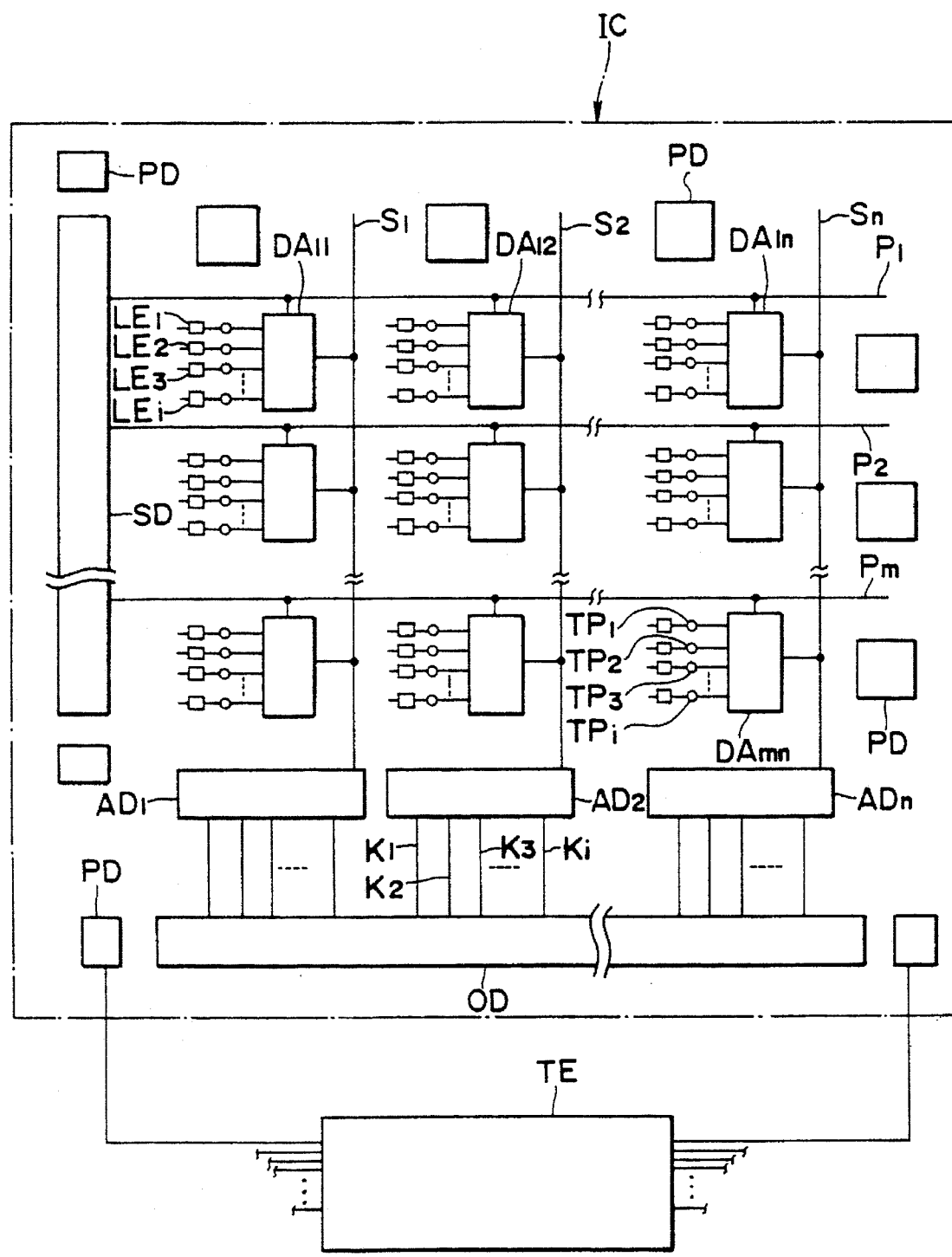
FIG. 1 is a schematic illustration showing a basic configuration of a testing apparatus for a semiconductor integrated circuit according to the present invention.

First, the basic configuration of the testing apparatus will be described. As shown in FIG. 1, the testing apparatus has "m" number of horizontally running probe lines $P_1$–$P_m$ (hereinafter, also simply referred to as P) and "n" number of vertically running sense lines $S_1$–$S_n$ (hereinafter, also simply referred to as S) intersecting the probe lines P at right angles as shown or any other desired angle, which are incorporated in an integrated circuit IC in which logic elements $LE_1LE_i$ (hereinafter, also simply referred to as LE) of various functions are interconnected with each other. A selection device SD is disposed in a left-hand peripheral region of the integrated circuit IC and connected to each probe line P. Additionally, "m×n" number of electronic switch devices $DA_{11}$–$DA_{mn}$ (hereinafter, also simply referred to as DA) are incorporated in the integrated circuit IC, one for each of the intersections between the probe lines P and the sense lines S. Analog-to-digital converting devices $AD_1$–$AD_n$ (hereinafter, also simply referred to as AD) are disposed in a bottom peripheral region of the integrated circuit IC and have their inputs connected to respective sense lines S. An observation device OD is disposed in another bottom peripheral region of the integrated circuit IC and connected to the analog-to-digital converting devices AD. An electronic test apparatus TE is disposed outside of the integrated circuit IC and connected to pads PD formed in a peripheral region of the integrated circuit IC through its probes.

Figure 2:
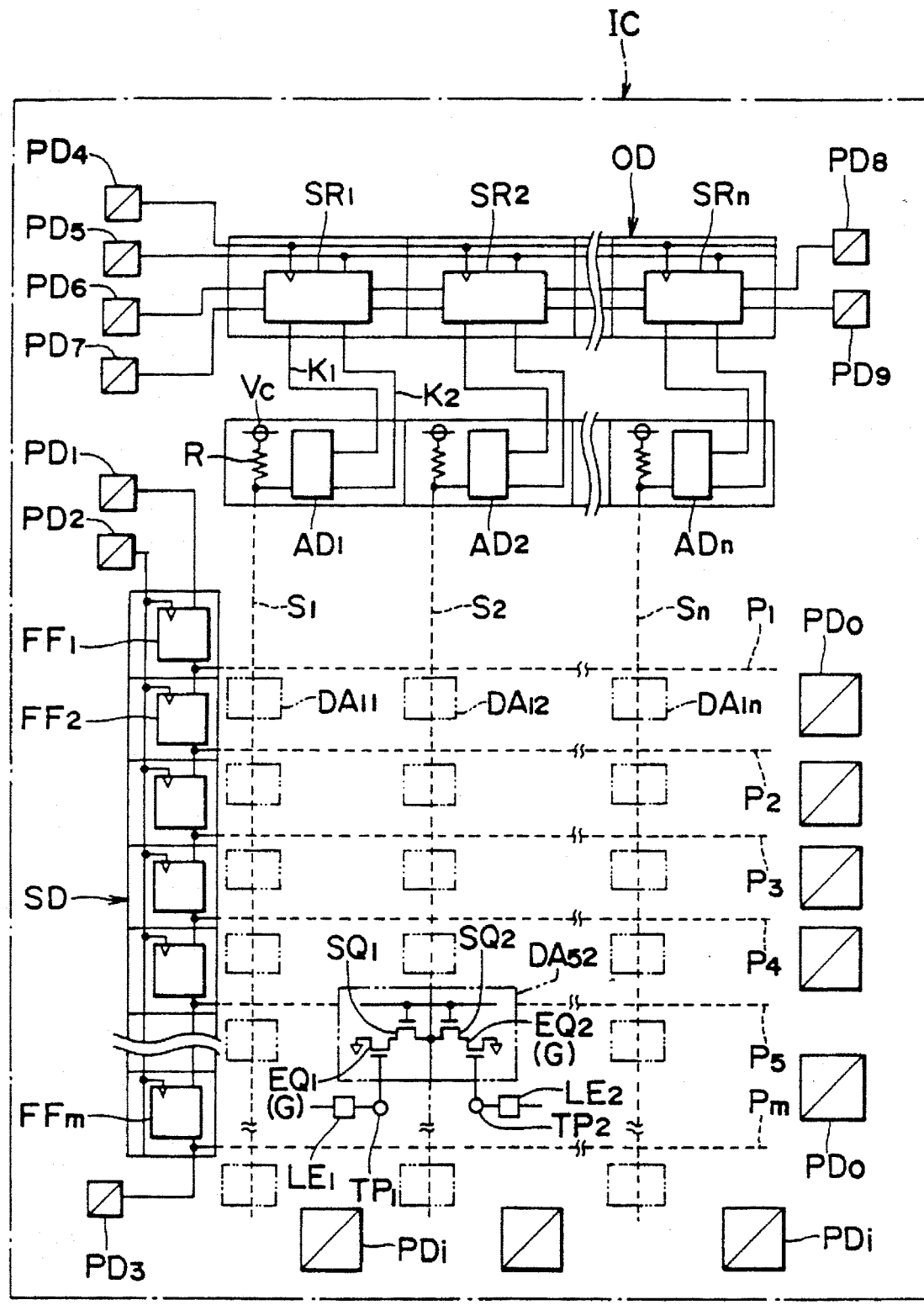
FIG. 2 is a schematic illustration showing a testing apparatus constructed in accordance with one embodiment of the present invention.

As shown in FIG. 2, each electronic switch device DA, e.g., $DA_{52}$, includes "i" number ("2" in the illustrated embodiment) of detector switches EQ, which constitute an electronic switch group G, connected to test points or terminals $TP_1$–$TP_i$ (hereinafter, also simply referred to as TP) on the output lines of "i" number of logic elements LE, respectively, and "i" number of selection switches SQ connected to the detector switches EQ with one-to-one correspondence and also connected to the corresponding probe line P and corresponding sense line S, respectively.

The selection device SD applies a selection signal of binary state "1" to one of the probe lines P in sequence for turning on the selection switches SQ of the electronic switch devices DA connected to the probe lines P which is being applied with the selection signal. As will be described hereinafter, when the selection signal is applied to the probe line P, a state indicating analog or multilevel signal is generated on each sense line S through the electronic switch device DA. This signal corresponds to a binary signal which is a combination of binary data appearing at the test points TP of the logic elements LE connected to the selected probe line P. Each of the analog-to-digital converting devices AD converts the multilevel signal generated on the sense line S, to which the device AD is connected, back into the same binary data as the original binary data on the "i" number of test points TP associated with each group of detector switches EQ, and is connected to the observation device OD through "i" number of output lines $K_1$–$K_i$ (hereinafter, also simply referred to as K), which correspond, respectively, to "i" test points TP connected to "i" number of detector switches EQ of the electronic switch group G. "I" number of binary data reproduced or converted by each analog-to-digital converting device AD are fed to the observation device OD through corresponding output lines K, respectively.

The observation device OD stores the reproduced or converted binary data temporarily and supplies them at a predetermined timing to the electronic test apparatus TE.

The electronic test apparatus TE is electronically connected to the input terminals of the logic element LE of input portion of the integrated circuit IC, to the selection device SD, and to the observation device OD, by contacting its probes with the pads PD formed in the integrated circuit IC, and applies various known test pattern signals to the integrated circuit IC and applies various data and clock signals to the selection device SD and observation device OD. Furthermore, it analyzes the reproduced binary data supplied from the observation device OD and the output signals supplied from the output pad PD to determine whether the integrated circuit IC operates properly or not, to identify defective logic elements LE, and to evaluate the performance of the integrated circuit IC. The electronic test apparatus TE includes a pattern signal generator, a timing signal generator, a control unit, memories, formatters, etc. Since it is a well known type of apparatus for testing an integrated circuit, its detailed description will be omitted here.

In addition, as well known in the art, the selection device SD and the observation device OD can be constructed by logic elements LE incorporated in the integrated circuit IC.

Now, a description will be made on a specific example of the detailed structure of the present testing apparatus with reference to FIG. 2. Of importance, in this example, the number of test points TP connected to each electronic switch group G is two. In other words, there are two test points or terminals which are associated with each of the intersections between the probe lines P and sense lines S in this example.

Electronic switch devices DA are disposed such that each electronic switch device DA corresponds to an associated one of the intersections, where "m" number of probe lines P and "n" number of sense lines S incorporated in an integrated circuit IC intersect each other. Each electronic switch device DA includes two detector switches $EQ_1$, $EQ_2$, constituting an electronic switch group G and comprised of N-channel MOSFETs connected to test points $TP_1$, $TP_2$ on output lines of logic element $LE_1$, $LE_2$, respectively, and two selection switches $SQ_1$, $SQ_2$ comprised of N-channel MOSFETs connected to the detector switches $EQ_1$, $EQ_2$, respectively.

A selection device SD for applying a selection signal to the probe lines P comprises a shift register including "m" number of D-type flip-flops $FF_1$–$FF_m$ connected in series, and each of analog-to-digital converting devices AD connected to the sense lines S, respectively, comprises a 2-bit A/D converter since two test points or terminals TP are associated with each of the intersections between the probe lines P and sense lines S in this specific embodiment. In addition, in order to generate a multilevel signal corresponding to a combination of the binary data on the test points $TP_1$, $TP_2$ connected respectively to the detector switches $EQ_1$, $EQ_2$ of each electronic switch group G, in cooperation with the detector switches $EQ_1$, $EQ_2$ and the selection switches $SQ_1$, $SQ_2$, each sense line S is connected to a constant voltage supply source $V_c$ of the integrated circuit IC through a resistor R.

The observation device OD includes "n" number of 2-bit serial/parallel type shift registers $SR_1$–$SR_n$ (hereinafter, also simply referred to as SR) connected in series, and each analog-to-digital converting device AD and its corresponding shift register SR are connected through two output lines $K_1$, $K_2$ corresponding to the test points $TP_1$, $TP_2$, respectively.

The selection device SD is connected to pads $PD_1$, $PD_2$, to which control data and clock signals from the electronic test apparatus TE are applied, respectively, and also connected to a pad $PD_3$ for sending the control data back to the electronic test apparatus TE. The observation device OD is connected to pads $PD_4$–$PD_7$, to which a clock signal from the apparatus TE, a mode setting signal for setting each shift register SR to be in a serial or parallel mode and observation data for testing are applied, respectively, and also connected to pads $PD_8$, $PD_9$ for supplying reproduced binary data to the electronic test apparatus TE.

In testing the integrated circuit IC, in the case where the selection signal for selecting the probe line P has a binary state "1" and the non-selection signal for not selecting the probe line P has a binary state "0", all probe lines P are first initialized by applying the non-selection signals thereto, and then one of the test pattern signals is applied to the circuit IC from the electronic test apparatus TE through input pads PD. Then, upon arrival of the first rising edge of the clock signal applied from the pad $PD_1$, the control data of binary state "1" is applied to the selection device SD to apply the selection signal to the probe line $P_1$, so that the selection switches $SQ_1$, $SQ_2$ connected to the probe line $P_1$ are turned on by the selection signal. At this time, multilevel signals corresponding to respective combinations of binary data on the test points $TP_1$, $TP_2$ are generated (in a manner as explained below) from "n" number of electronic switch groups G associated with the probe line $P_1$ on the corresponding sense lines S, respectively. Then, each multilevel signal generated on the corresponding signal line S is reproduced or converted back into the same binary data as the original binary data on the test points $TP_1$, $TP_2$ by the analog-to-digital converting device AD corresponding to the sense line S. Then the thus reproduced or converted binary data are supplied to the corresponding shift register SR of the observation device OD through the output lines $K_1$, $K_2$ corresponding to the test points $TP_1$, $TP_2$, respectively. The reproduced binary data supplied from each analog-to-digital converting device AD are stored temporarily in the observation device OD, and then supplied to the electronic test apparatus TE from the observation device OD at a predetermined timing.

The selection signal is then applied to the other probe lines P from the probe line $P_1$ in sequence by applying the control data of binary state "1" to the selection device SD at each timing of arrival of the rising edge of the clock signal, so that the selection signal is applied to the probe line $P_m$ at the timing of the arrival of the rising edge of the "m"th clock signal. In this manner, the selection signal is applied to the remaining probe lines P sequentially, and, thus, steps of generating of the multilevel signals on the sense lines S, reproducing of the binary data, supplying of the reproduced binary data to the observation device OD, and supplying of the reproduced binary data to the electronic test apparatus TE are carried out in sequence repetitively as described above.

Upon completion of the testing operation regarding one of the test pattern signals, another test pattern signal is selected, and then the testing operation is carried out through all probe lines P similarly by repeating the above-described steps, and the testing operation is carried out with regard to all of the remaining test pattern signals by repeating the above-described steps.

When the selection signal is applied to probe line $P_5$, for example, a multilevel signal corresponding to one of four binary signals or four combinations of binary data of "1" and "0" on the test points $TP_1$, $TP_2$ is generated on the sense line $S_2$, for example, through a constant voltage supply $V_c$, a resistor R, selection switches $SQ_1$, $SQ_2$ and detector switches $EQ_1$, $EQ_2$, and then the multilevel signal is applied to the analog-to-digital converting device $AD_2$. Thus, the multilevel signal is reproduced or converted to the same binary data as the original binary data on the test points $TP_1$, $TP_2$ by the analog-to-digital converting device $AD_2$, and then the reproduced binary data are supplied to corresponding shift register $SR_2$ of the observation device OD through the output lines $K_1$, $K_2$ corresponding to the test points $TP_1$, $TP_2$, respectively. Similarly, in parallel with the foregoing, the binary data on the test points $TP_1$, $TP_2$ of the other groups connected to the probe line $P_5$ through the other electronic switch devices DA are converted into multilevel signals, converted into binary data by the corresponding analog-to-digital converting devices AD, and supplied to the observation device OD, respectively.

The N groups of reproduced or converted binary data supplied from respective analog-to-digital converting devices AD to the observation device OD are stored in the observation device OD at the time when each shift register SR of the observation device OD is set in a parallel mode by the mode setting signal and the first rising edge of the clock signal applied from the pad $P_4$ arrives. Then, after each shift register SR has been set in a serial mode by the mode setting signal, the reproduced or converted binary data are supplied from shift register SR of one sense line S to the shift register SR of its neighboring sense line S in sequence and ultimately to the electronic test apparatus TE through the pads $PD_8$, $PD_9$ each time when the clock signal is applied to the observation device OD.

Now, a detailed description will be made with reference to FIGS. 3 and 4 to an example of combinations of binary data on test points TP and corresponding multilevel signals generated on a sense line S. The following description will be made specifically with respect to multilevel signals generated on the sense line $S_2$ by applying the selection signal to the probe line $P_5$ as an example.

Figure 3:
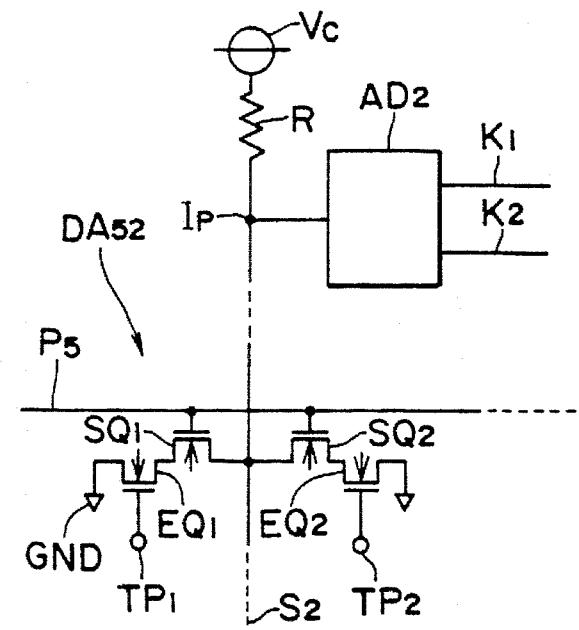
FIG. 3 is a circuit diagram showing one embodiment of an electronic switch device and its associated analog-to-digital converting device provided in the apparatus shown in FIG. 2.
Figure 4:
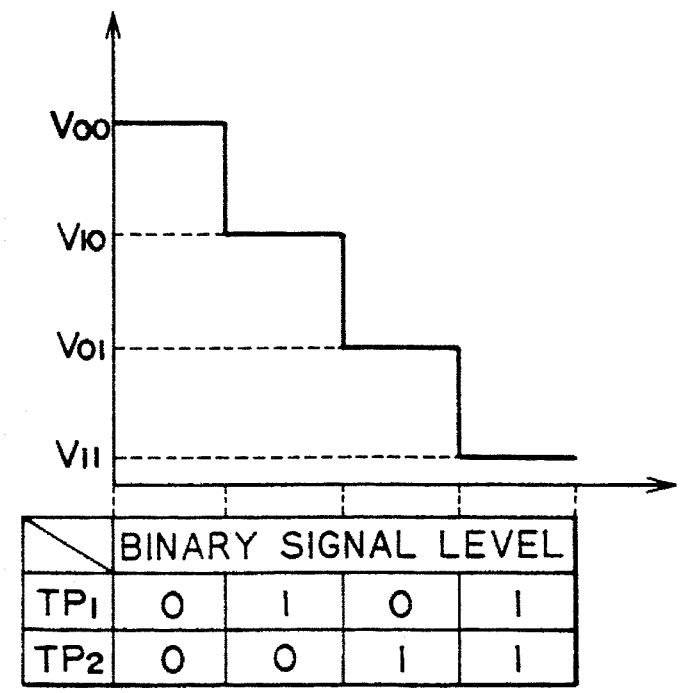
FIG. 4 is a graph showing an example of a multilevel signal produced on a sense line using the structure shown in FIG. 3.

As shown in FIG. 3, an electronic switch device $DA_{52}$, which is disposed at an intersection between the probe line $P_5$ and the sense line $S_2$, includes two detector switches $EQ_1$, $EQ_2$, each comprised of an N-channel MOSFET and connected to a corresponding test point $TP_1$, $TP_2$, and two selection switches $SQ_1$, $SQ_2$, each comprised of an N-channel MOSFET and connected to a corresponding detector switch $EQ_1$, $EQ_2$. Drains, sources and gates of detector switches $EQ_1$, $EQ_2$ are connected to the corresponding test points $TP_1$, $TP_2$, ground GND of the integrated circuit IC and the sources of the corresponding selection switches $SQ_1$, $SQ_2$, respectively, and gates and drains of the selection switches $SQ_1$, $SQ_2$ are connected to the probe line $P_5$ and the sense line $S_2$, respectively.

By connecting the detector switches $EQ_1$, $EQ_2$ and the selection switches $SQ_1$, $SQ_2$ in this manner, when a selection signal of binary state "1" is not applied to the probe line $P_5$, the selection switches $SQ_1$, $SQ_2$ are not turned on, and, therefore, the sense line $S_2$ and the ground GND are electrically separated from each other. On the other hand, when the selection signal is applied to the probe line $P_5$, since the selection switches $SQ_1$, $SQ_2$ are turned on, the sense line $S_2$ and the ground GND are connected together or separated from each other electrically depending on whether binary data on the test points $TP_1$, $TP_2$ are "0" or "1".

By connecting the sense line $S_2$ to the constant voltage supply source $V_c$ with a predetermined impedance, when the selection signal is applied to the probe line $P_5$, one of four current paths, which define four voltage levels of a multilevel signal, for flowing electric current on the sense line $S_2$ from the constant voltage supply source $V_c$ through resistor R is formed depending on combinations of the binary data appearing on the test points $TP_1$, $TP_2$. In one embodiment, in order to make the magnitude of electric currents flowing through the four current paths different from each other, i.e., to define four different levels of a multilevel signal, the W/L values of detector switches $EQ_1$, $EQ_2$ are set at the same value, and the W/L values of selection switches $SQ_1$, $SQ_2$ are set at different values from each other. As well known in the art, parameter W indicates the width of a channel of an MOS transistor and parameter L indicates the length of its channel. Thus, the W/L value effectively defines an on-resistance of a MOSFET. In other words, the electric current flows from the constant voltage supply source $V_c$ to ground GND through one of the four different current paths selectively depending on any of four combinations of binary data on test points $TP_1$, $TP_2$; that is, (1) both of the binary data on test points $TP_1$, $TP_2$ being "0", (2) the binary data on test point $TP_1$ being "1" and the binary data on test point $TP_2$ being "0", (3) the binary data on test point $TP_1$ being "0" and the binary data on test point $TP_2$ being "1", and (4) both of the binary data on test points $TP_1$, $TP_2$ being "1". And, therefore, a multilevel signal having one of four different voltage levels, depending on the current path selected, is generated at $I_P$, where sense line $S_2$ and the input terminal of analog-to-digital converting device $AD_2$ intersect each other.

Denoting these four voltage levels of such a multilevel signal as $V_{00}$, $V_{10}$, $V_{01}$ and $V_{11}$ corresponding to the above-mentioned four combinations of binary data appearing at test points $TP_1$, $TP_2$, the W/L values of selection switches $SQ_1$, $SQ_2$ are set at different values from each other so as to satisfy a relationship of $V_{00} > V_{10} > V_{01} > V_{11}$.

One of the four levels of such a multilevel signal corresponding to four combinations of binary data on test points $TP_1$, $TP_2$ is supplied to the analog-to-digital converting device $AD_2$ and then converted back into binary data which are the same as the original binary data previously present on test points $TP_1$, $TP_2$ by the analog-to-digital converting device $AD_2$. And, the binary data thus obtained are then supplied to the observation device OD through output lines $K_1$, $K_2$.

In the embodiment shown in FIG. 3, detector switches $EQ_1$, $EQ_2$ have the same W/L value and selection switches $SQ_1$, $SQ_2$ have different W/L values from each other. As an alternative, electronic switches $EQ_1$, $EQ_2$ may have different W/L values and detector switches $EQ_1$, $EQ_2$ may have the same W/L value. As a further alternative, both of detector switches $EQ_1$, $EQ_2$ and selection switches $SQ_1$, $SQ_2$ may have different W/L values one from another.

In the structure shown in FIG. 3, constant power supply $V_c$ is connected to sense line $S_2$ via resistor R so that a multilevel signal having one of the four possible voltage levels is produced on sense line $S_2$ and the multilevel signal thus produced on sense line $S_2$ is then supplied to the analog-to-digital converting device $AD_2$ via interconnecting point $I_P$. Then, the multilevel signal is converted back into a digital signal comprised of the same two binary data as the original data present on test points $TP_1$, $TP_2$. However, depending on the manner of testing operation, the multilevel signal produced on the sense line $S_2$ may be directly used. That is, since the voltage level of the multilevel signal is uniquely defined depending on a particular combination of binary data appearing at test points $TP_1$, $TP_2$, it is known in advance as to what level the multilevel signal should have when the logic elements LE connected to these test points $TP_1$, $TP_2$ are subjected to a testing operation. Therefore, the multilevel signal produced on the sense line $S_2$ can be directly used for comparison with an expected voltage level. In this case, the interconnecting point $I_P$ can be connected directly to a pad PD and then to the electronic test apparatus TE, and the interconnecting point $I_P$ does not need to be connected to power source $V_c$, resistor R and analog-to-digital converting device AD. In this case, however, such a pad can be connected to an exterior power supply and an external resistor to set a desired reference voltage level at such a pad. Thus, alternatively such a pad may also be connected to a reference voltage established inside of the circuit, if desired.

FIGS. 5a–5e illustrate various modifications of a structure for providing a multilevel signal on sense line S. It is to be noted that, as described above, the interconnecting point IP may be connected as shown in FIG. 3 or directly to the electronic test apparatus TE through a pad PD.

Figure 5A:
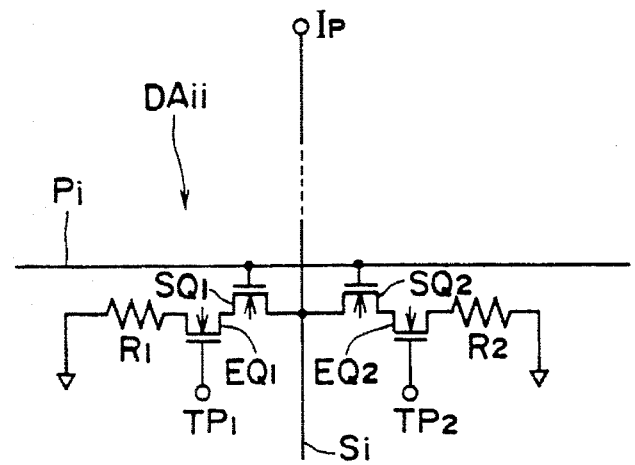
FIGS. 5a–5e are schematic illustrations showing various modifications of the structure shown in FIG. 3.

The structure shown in FIG. 5a is similar in many respects to that shown in FIG. 3 and it includes two electronic (detector) switches $EQ_1$, $EQ_2$ and two selector switches $SQ_1$, $SQ_2$. However, in the structure of FIG. 5a, there are also provided two resistors $R_1$, $R_2$ such that resistor $R_1$ is connected between ground and detector switch $EQ_1$ and resistor $R_2$ is connected between ground and detector switch $EQ_2$. Alternatively, the resistors $R_1$, $R_2$ may be disposed at different locations. For example, resistor $R_1$ may be located between detector switch $EQ_1$ and selector switch $SQ_1$ or between selector switch $SQ_1$ and sense line $S_i$. The same arguments hold true for resistor $R_2$. The resistors $R_1$ and $R_2$ may be formed by diffusion or by diode-connected MOS-FETs.

With the structure of FIG. 5a, all of the detector and selector switches EQ and SQ may have the same configuration (W/L) as long as $R_1$ and $R_2$ have different resistances. As an alternative, the detector and selector switches EQ and SQ may have different W/L values at least partly as described above.

Figure 5B:
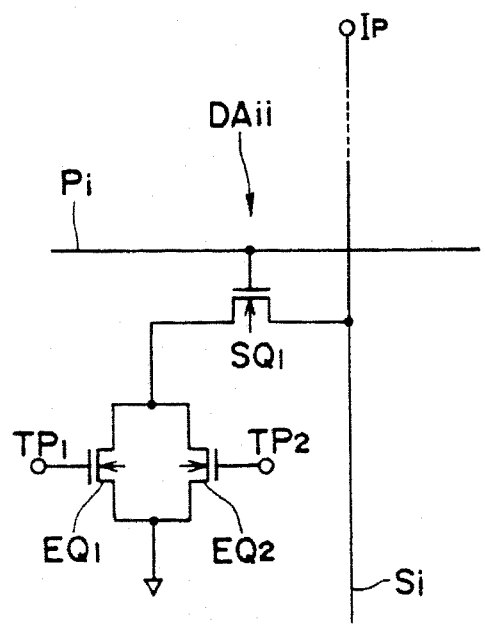

FIG. 5b shows another structure which includes only one selector switch $SQ_1$ and two detector switches $EQ_1$, $EQ_2$. In this structure, the two detector switches $EQ_1$, $EQ_2$ are connected in parallel between ground and selector switch $SQ_1$. Thus, there is an advantage of reduction in the number of components in achieving the same function. In this structure, however, the detector switches $EQ_1$, $EQ_2$ must have different W/L values from each other.

Figure 5C:
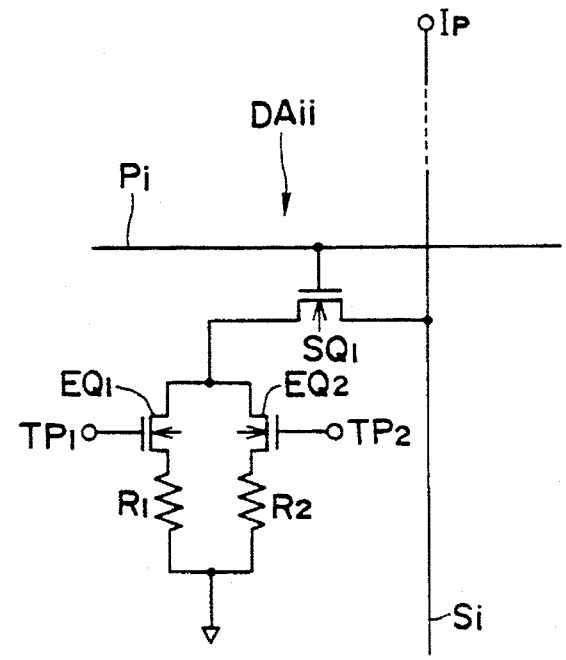

FIG. 5c is a modification of the structure shown in FIG. 5b. That is, a pair of resistors $R_1$ and $R_2$ is provided as connected as shown. With this structure, as long as different resistances are provided by resistors $R_1$ and $R_2$, both of detector switches $EQ_1$, $EQ_2$ may have the same configuration (or same W/L). It is to be noted that the location of resistors $R_1$, $R_2$ is not limited to that shown in FIG. 5c.

Figure 5D:
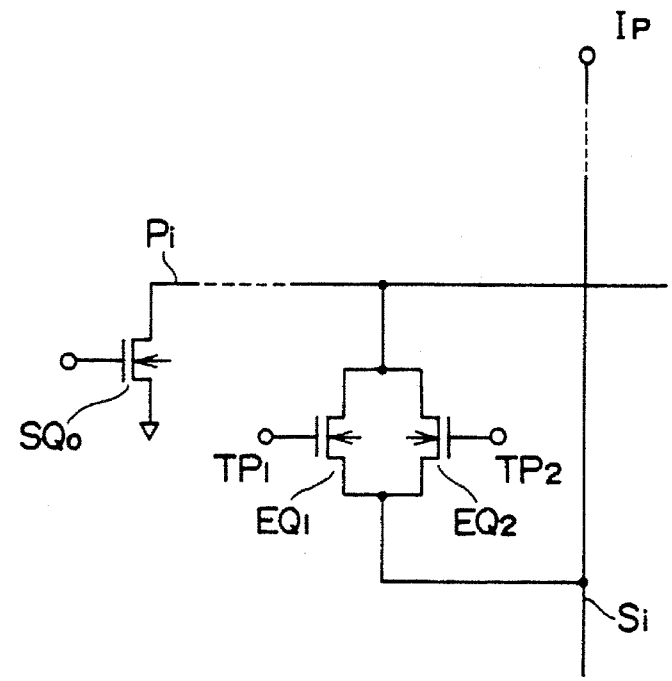

FIG. 5d shows a further alternative structure in producing a multilevel signal on sense line $S_i$. In this structure, there is provided a single selector switch $SQ_0$ for each probe line $P_i$ and thus the probe line $P_i$ is selected when the common selector switch $SQ_0$ is turned on, whereas the probe line $P_i$ is deselected when the common selector switch $SQ_0$ is turned off. Thus, depending on whether the selector switch $SQ_0$ is turned on or off, the probe line $P_i$ is set in a selected state or deselected state, respectively. In this structure, there is no need to provide a selector switch for each intersection between probe and sense lines $P_i$ and $S_i$, but only one common selector switch needs to be provided for each probe line $P_i$.

The structure shown in FIG. 5d also includes a pair of detector switches $EQ_1$, $EQ_2$, which are connected in parallel between one probe line $P_i$ and one sense line $S_i$. In this structure, the detector switches $EQ_1$, $EQ_2$ must have different W/L values from each other.

Figure 5E:
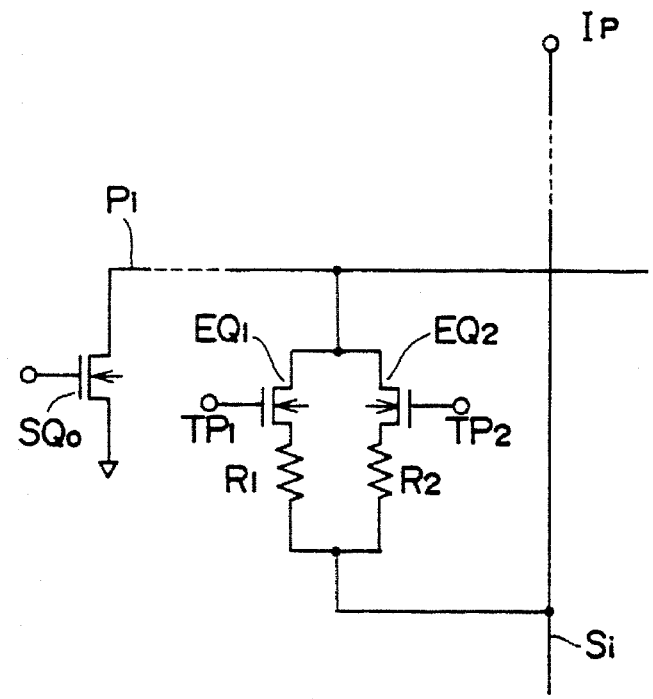

FIG. 5e shows a modification of the structure shown in FIG. 5d, and as shown this structure is similar to that of FIG. 5d excepting the additional provision of a pair of resistors $R_1$, $R_2$. As long as resistors $R_1$, $R_2$ have different resistances, the detector switches $EQ_1$, $EQ_2$ may have the same configuration (W/L) or, if desired, they may also have different configurations.

Figure 15:
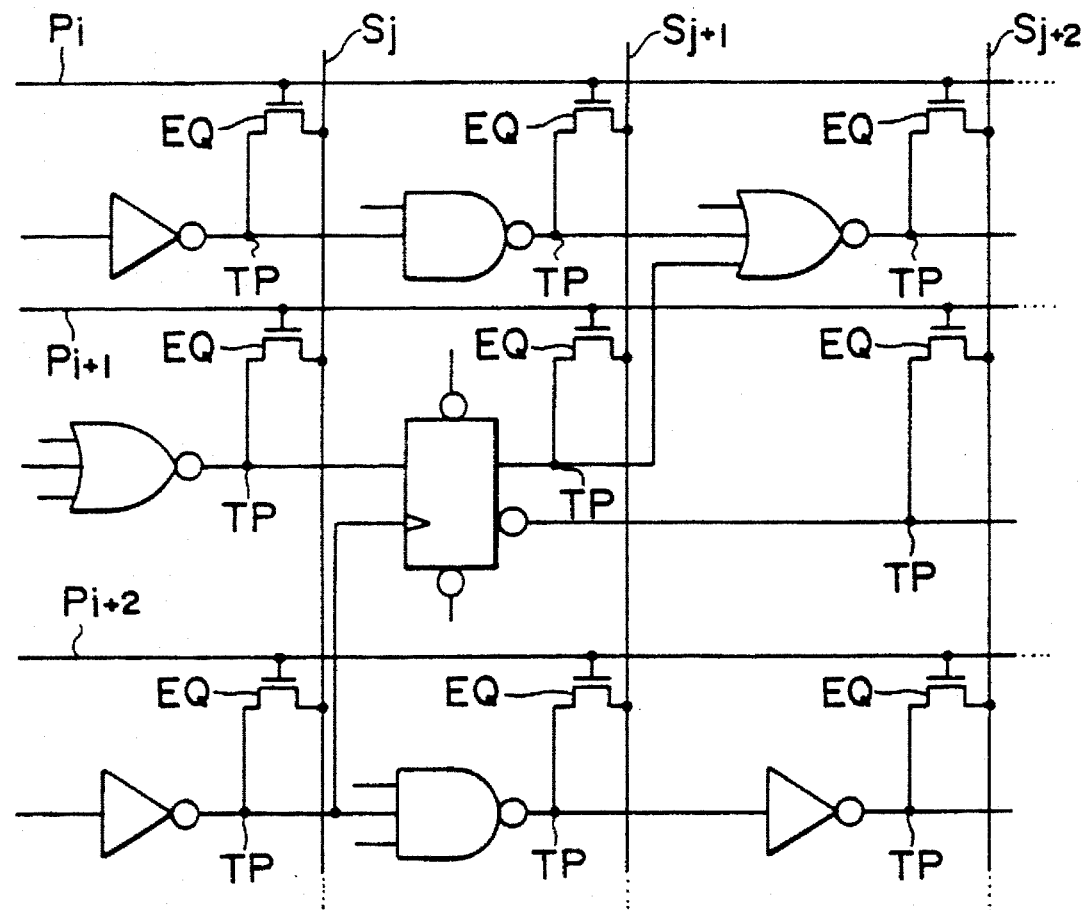
FIG. 15 is a schematic illustration showing a typical prior testing apparatus in which one test point is associated with each intersection between probe lines and sense lines.

In any of the above-described variations, depending on the conditions of binary data appearing at two test points $TP_1$, $TP_2$, there may be provided one of four different resistances between ground and sense line $S_i$ so that there is produced a multilevel signal having one of the four possible voltage levels on sense line $S_i$. Therefore, by using a structure to produce such a multilevel signal having at least four voltage levels, two test points $TP_1$, $TP_2$ may be associated with one intersection between a probe line $P_i$ and sense line $S_i$ so that the number of probe lines to be provided can be reduced to a half as compared with the prior art structure as described above with reference to FIG. 15. This a significant reduction in the number of probe lines and it allows a significant reduction of the area occupied by the present test apparatus. It should also be noted that since at least two current paths having different resistances may be provided to provide a multilevel signal having four different voltage levels, one of the resistors R1, R2 may be discarded, if desired, in the case where the detector MOSFETs EQ1, EQ2 have the same configuration (W/L).

Figure 6:
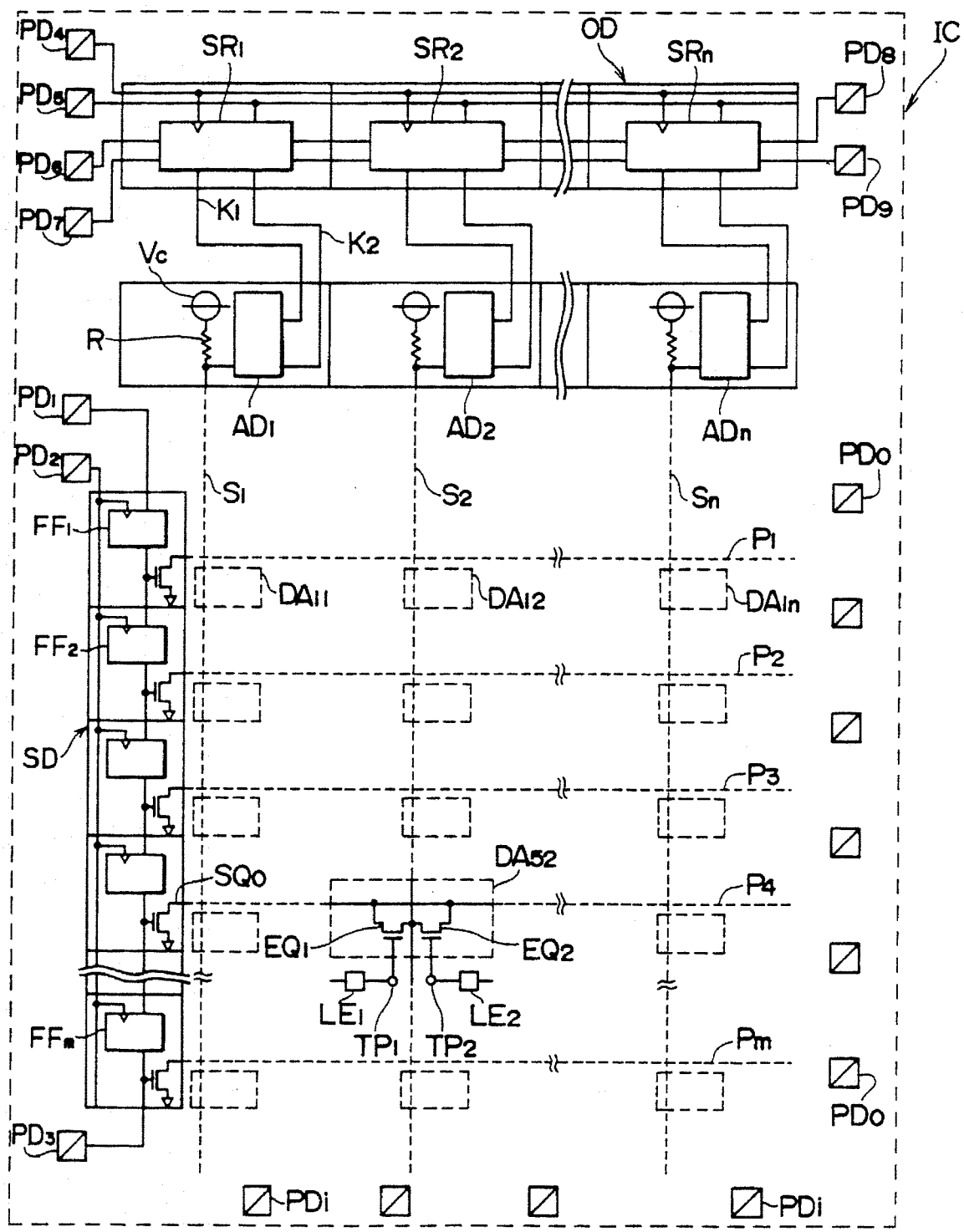
FIG. 6 is a schematic illustration showing a testing apparatus constructed in accordance with another embodiment of the present invention using the structure shown in FIG. 5d.

FIG. 6 illustrates a testing apparatus constructed in accordance with another embodiment of the present invention. The testing apparatus shown in FIG. 6 may be constructed by substituting the structure for producing a multilevel signal in the testing apparatus shown in FIG. 2 with the structure for producing a multilevel signal shown in FIG. 5d. That is, in the testing apparatus shown in FIG. 6, a pair of detector switches $EQ_1$, $EQ_2$ is connected in parallel between probe line $P_4$ and sense line $S_2$ and a selector switch $SQ_0$ is connected between probe line $P_4$ and ground. The remaining structure of the embodiment shown in FIG. 6 is the same as that of FIG. 2. Thus, in the testing apparatus of FIG. 6, a multilevel signal produced on sense line $S_i$ is converted into a binary signal comprised of binary data by a corresponding analog-to-digital converting device $AD_i$, which is then compared with the original binary data.

Figure 7:
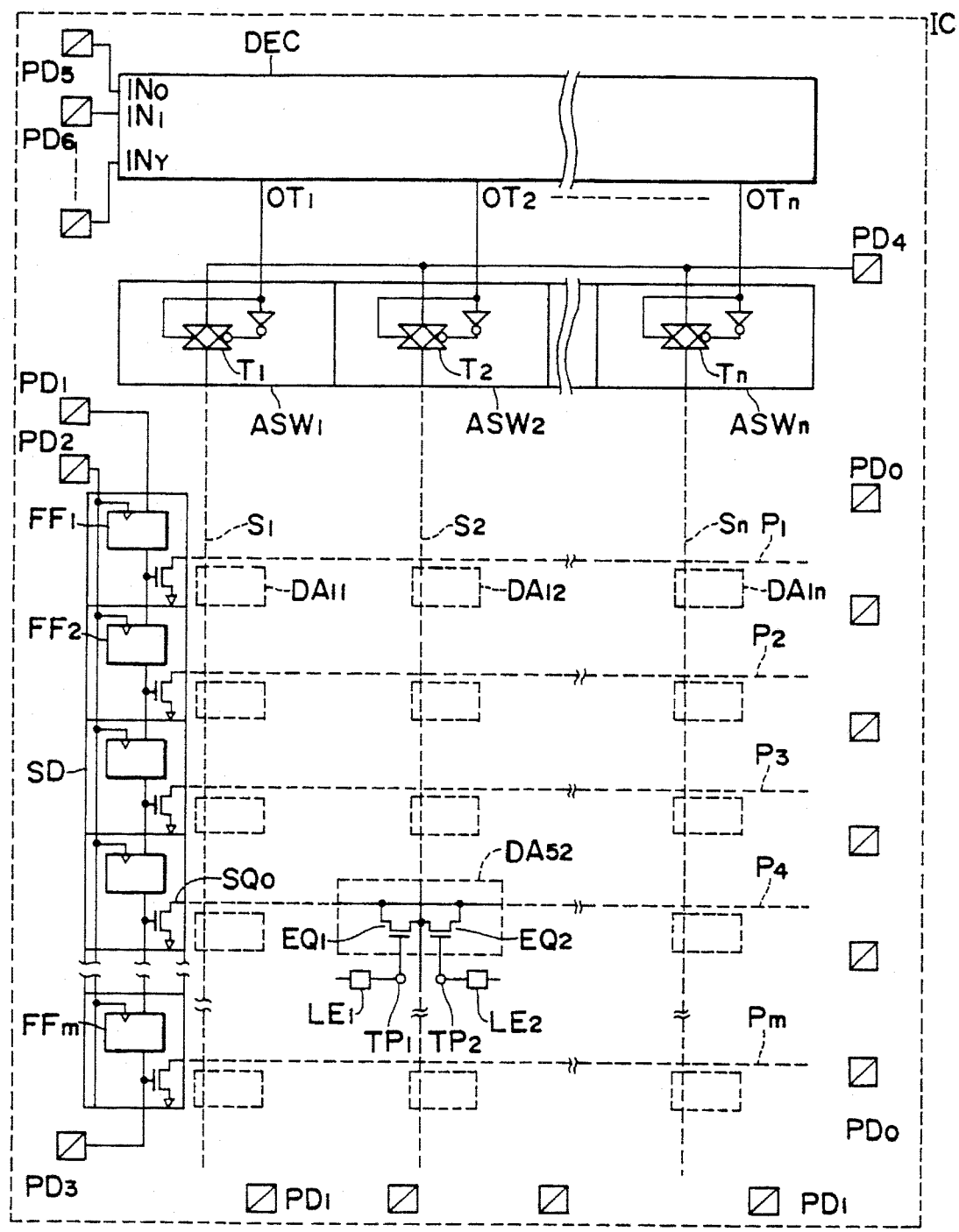
FIG. 7 is a schematic illustration showing a testing apparatus constructed by modifying the structure shown in FIG. 6 such that a multilevel signal can be taken out of the integrated circuit.

FIG. 7 illustrates a modification of the testing apparatus shown in FIG. 6. In the testing apparatus shown in FIG. 7, each of sense lines $S_i$ is connected to a pad $PD_4$ through a corresponding analog switch $ASW_i$, which is comprised of a transmission gate and an invertor in the illustrated embodiment. Each of the analog switches $ASW_i$ is connected to a corresponding one of a plurality of outputs $OT_i$ of a decoder DEC which has its inputs $IN_i$ connected to respective pads $PD_i$. Thus, in accordance with an activation signal supplied to pads $PD_i$ from the electronic test apparatus TE, analog switches $ASW_i$ are activated in sequence so that the sense lines $S_i$ are connected to pad $PD_4$ one after another in sequence. If pad $PD_4$ is connected to an exterior power supply voltage through a resistor, a predetermined voltage can be set at pad $PD_4$. Thus, a multilevel signal having one of the four possible voltage levels may be produced on a corresponding sense line $S_i$ depending on a binary signal comprised of two binary data appearing at two test points $TP_1$, $TP_2$, respectively, when a corresponding probe line $P_i$ has been selected, and the thus produced multilevel signal may be taken out through pad $PD_4$.

Figure 8:
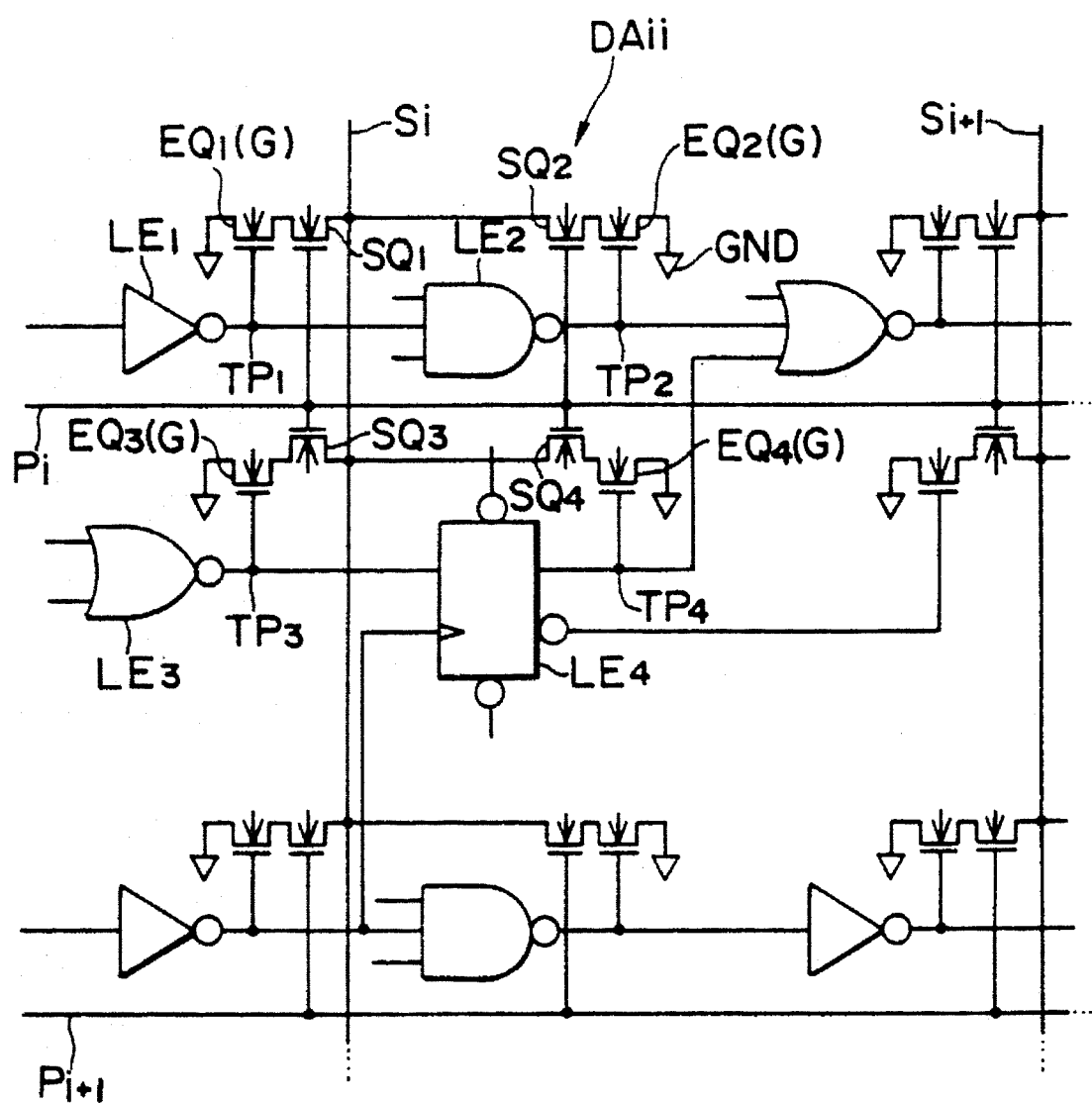
FIG. 8 is a schematic illustration showing a testing apparatus having a four test point structure constructed in accordance with a still further embodiment of the present invention.

FIG. 8 illustrates a test apparatus constructed in accordance with another embodiment of the present invention. In this example, it is important to note that the number of test points TP connected to each electronic (detector) switch group G is four. In other words, four test points (terminals) TP or four logic elements to be tested are provided to be associated with one of the intersections between probe lines $P_i$ and sense lines $S_i$.

In the vicinity of an intersection where sense line $S_1$ intersects with probe line $P_1$, INVERTER $LE_1$, NAND $LE_2$, NOR $LE_3$, and D-type FLIP-FLOP $LE_4$ are disposed as a group of logic elements LE surrounding the intersection. On output lines of logic elements $LE_1$–$LE_3$ and on a positive logic output line of logic element $LE_4$, test points $TP_1$–$TP_4$ are set, respectively, and electronic or detector switches $EQ_1$–$EQ_4$ as an electronic switch group G are connected to test points $TP_1$–$TP_4$, respectively. These test points $TP_1$–$TP_4$ are arranged around the intersection between probe lines $P_i$ and sense lines $S_i$ such that they are located at different quadrants around the intersection.

Each of detector switches $EQ_1$–$EQ_4$ includes an N-channel MOSFET, and the gates, sources and drains of detector switches $EQ_1$–$EQ_4$ are connected to the corresponding test points $TP_1$–$TP_4$, ground GND of integrated circuit IC, and corresponding selection switches $SQ_1$–$SQ_4$ each of which includes an N-channel MOSFET, respectively. The gates and drains of selection switches $SQ_1$–$SQ_4$ are connected to probe line $P_i$ and sense line $S_i$, respectively.

By connecting detector switches $EQ_1$–$EQ_4$ and selection switches $SQ_1$–$SQ_4$ in this manner, there can be formed sixteen different current paths for flowing electric current on sense line $S_i$ from the constant voltage supply source $V_c$ through resistor R depending on a particular combination of binary data on test points $TP_1$–$TP_4$. In order to differentiate among the magnitudes of such currents flowing through sixteen different current paths, the W/L values of detector switches $EQ_1$–$EQ_4$ are set at the same value, but the W/L values of selection switches $SQ_1$–$SQ_4$ are set at different values from each other. Thus, by setting the W/L values of detector switches $EQ_1$–$EQ_4$ and selection switches $SQ_1$–$SQ_4$ in this manner, a multilevel signal having a voltage level corresponding to one of various combinations of the binary data appearing at test points $TP_1$–$TP_4$ can be produced on sense line $S_i$.

Figure 9:
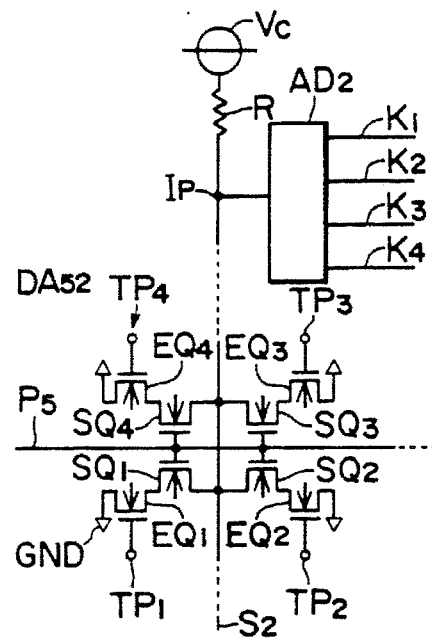
FIG. 9 is a schematic illustration showing the basic structure of the four test point structure shown in FIG. 8.
Figure 10:
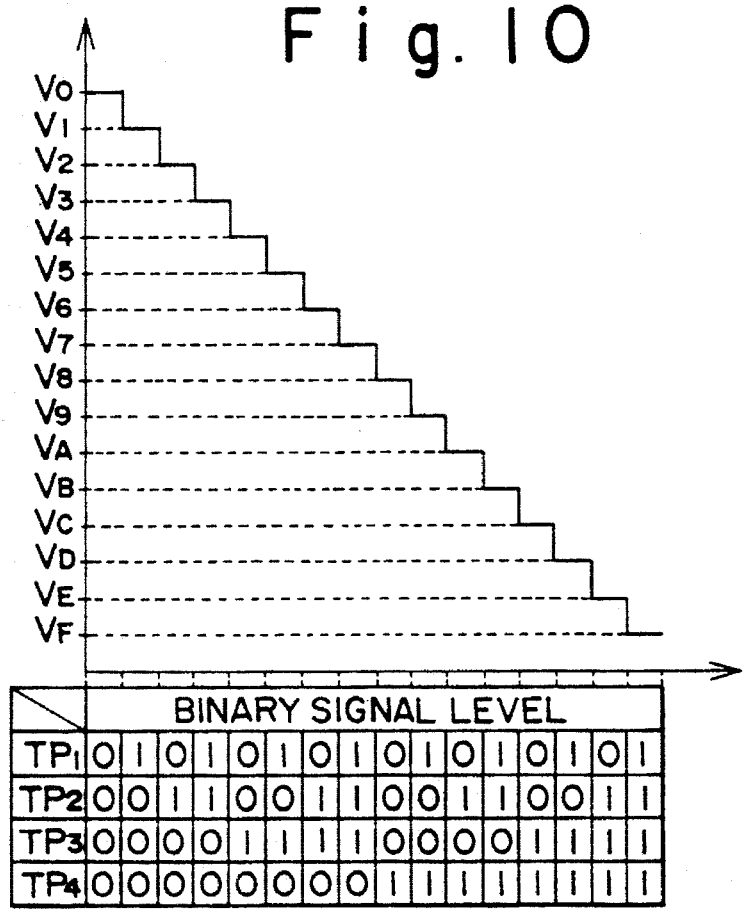
FIG. 10 is a graph showing how a multilevel signal having one of sixteen possible different voltage levels can be produced by four binary numbers appearing at four test points in the structure shown in FIG. 9.

Referring now to FIGS. 9 and 10, the four test point embodiment illustrated in FIG. 8 will be described more in detail. FIG. 9 illustrates an arrangement of four test points $TP_1$–$TP_4$ around an intersection between probe line $P_5$ and sense line $S_2$ in a testing apparatus constructed in accordance with one embodiment of the present invention. As shown, these four test points $TP_1$–$TP_4$ are arranged in respective quadrants around the intersection. It is to be noted that although not shown in FIG. 9, each of these four test points $TP_1$–$TP_4$ is connected to receive an output from an associated logic element LE to be tested as shown in FIG. 8 and provided in the integrated circuit IC.

There is provided an electronic switch device $DA_{52}$ in association with the intersection between probe $P_5$ and sense $S_2$ lines and the four test points $TP_1$–$TP_4$ are operatively coupled to the probe $P_5$ and sense $S_2$ lines through the electronic switch device $DA_{52}$, which includes four detectors $EQ_1$–$EQ_4$ and four selectors $SQ_1$–$SQ_4$. For example, the selector $SQ_1$ is comprised of an MOSFET having its gate connected to probe line $P_5$, its one source/drain connected to sense line $S_2$, and its remaining source/drain connected to one source/drain of detector $EQ_1$ which has its remaining source/drain connected to a reference voltage, such as ground, and its gate connected to test point $TP_1$. The other selectors $SQ_2$, $SQ_3$ and $SQ_4$ and detectors $EQ_2$, $EQ_3$ and $EQ_4$ are similarly connected.

Thus, when the probe line $P_5$ has been selected, all of the four selectors $SQ_1$–$SQ_4$ are turned on so that all of the four detectors $EQ_1$–$EQ_4$ are set to be operatively coupled between the sense line $S_2$ and the reference voltage or ground in the illustrated embodiment. Accordingly, depending on the binary data supplied to the respective test points $TP_1$–$TP_4$, the detectors $EQ_1$–$EQ_4$ are selectively turned on so that one or more of the four possible current paths between the sense line $S_2$ and ground are selectively established. As a result, since the detectors $EQ_1$–$EQ_4$ have different on-resistances or W/L values and the selectors $SQ_1$–$SQ_4$ have the same on-resistances or W/L values in this embodiment, there are sixteen possible resistances or voltage levels which can be established by this electronic switch device $DA_{52}$.

As shown in FIG. 10, if all of the binary data supplied to the four test points $TP_1$–$TP_4$ are "0", there is established no current path between the sense line $S_2$ and ground through the electronic switch device $DA_{52}$, and thus there is provided a highest impedance so that the voltage level on sense line $S_2$ in this instance is at the highest value of $V_0$. On the other hand, if binary data "1" is supplied to test point $TP_1$ and binary data "0" is supplied to all of the remaining test points $TP_2$–$TP_4$, the detector $EQ_1$ is turned on so that there is established only one current path between the sense line $S_2$ and ground. Thus, there is established the second highest resistance which produces voltage level $V_1$ on the sense line $S_2$. In this manner, in principle, as the number of binary data "1" applied to the test points $TP_1$–$TP_4$ increases, i.e., as the number of detectors $EQ_1$–$EQ_4$ which are turned on increases, there are established more current paths between the sense line $S_2$ and ground so that the voltage level on the sense line $S_2$ gradually decreases. Moreover, the four detectors $EQ_1$–$EQ_4$ are so structured that different voltages levels are established on the sense line $S_2$ even if any two or three of these four detectors $EQ_1$–$EQ_4$ are turned on at the same time. As a result, as shown in FIG. 10, there can be established sixteen different voltage levels $V_0$–$V_F$ on the sense line $S_2$ depending on combinations of four binary data supplied to the four test points $TP_1$–$TP_4$.

In the structure shown in FIG. 9, the sense line $S_2$ is connected to a constant power supply source $V_c$ through a resistor R similarly with the structure shown in FIG. 3. The sense line $S_2$ is also connected to an input of an analog-to-digital converting device $AD_2$ at its interconnecting node IP and there are four output leads extending from the analog-to-digital converting device $AD_2$. Thus, in the structure shown in FIG. 9, there is produced a multilevel signal having one of sixteen possible voltage levels $V_{0-VF}$ depending on a particular combination of four binary data supplied to test points $TP_1$–$TP_4$. And, the multilevel signal thus produced on the sense line $S_2$ is supplied to the analog-to-digital converting device $AD_2$ where the multilevel signal is converted into a binary signal comprised of four binary data which corresponds to the original combination of binary data supplied to the test points $TP_1$–$TP_4$. These converted binary data are supplied to output leads $K_1$–$K_4$ of analog-to-digital converting device $AD_2$ and then to pads PD of the integrated circuit IC.

Alternatively, similarly with the previously described embodiments, the multilevel signal produced on the sense line $S_2$ may be supplied directly to a pad PD of the integrated circuit IC from the interconnecting node IP. In this case, the multilevel signal produced on the sense line $S_2$ is directly compared with a predetermined reference level in an analog format. As a further alternative, the multilevel signal produced on the sense line $S_2$ may be supplied to an externally provided analog-to-digital converting device (not shown) before being supplied to the electronic test apparatus TE.

Figure 11A:
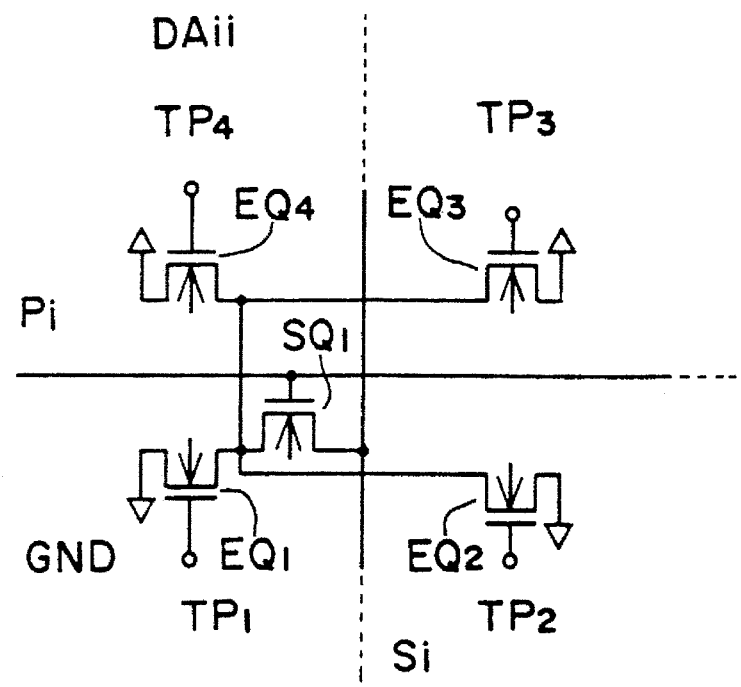
FIGS. 11a and 11b are schematic illustrations showing two alternative modifications of the structure shown in FIG. 10.
Figure 11B:
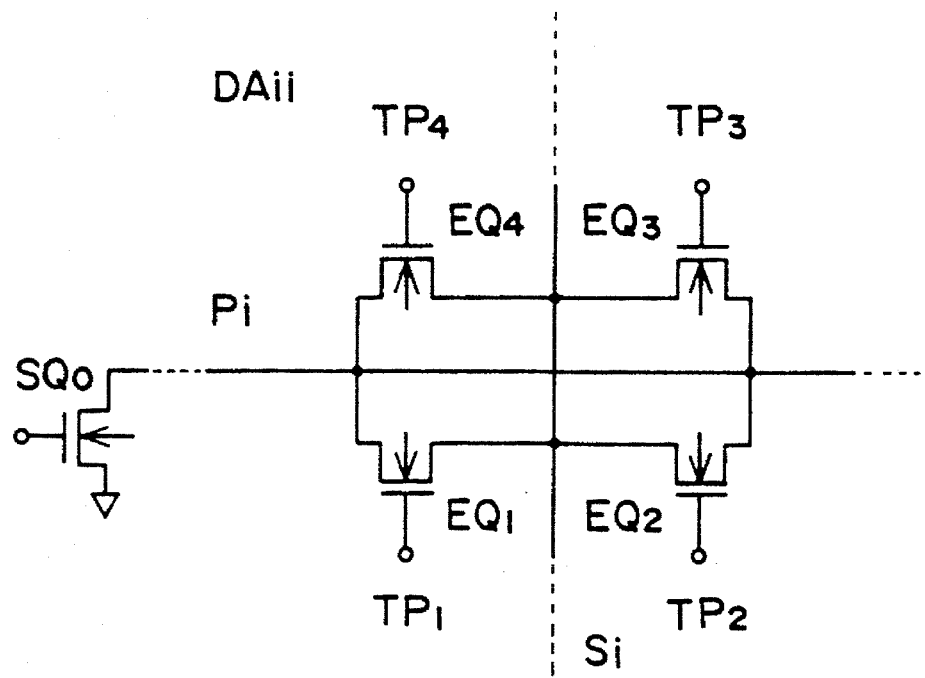

FIGS. 11a and 11b show two representative modifications of the structure for producing a multilevel signal having sixteen possible voltage levels at maximum in the four test point embodiment shown in FIG. 9. In the structure shown in FIG. 11a, an electronic switch device $DA_{ij}$ provided in association with an intersection between probe $P_i$ and sense $S_j$ lines includes one selector $SQ_1$ and four detectors $EQ_1$–$EQ_4$. That is, the selector $SQ_1$ is comprised of a MOSFET having its gate connected to the probe line $P_i$, its one drain/source connected to the sense line $S_j$ and its other drain/source connected to a common connecting node to which one drain/source of each of the four detectors $EQ_1$–$EQ_4$ is connected. The detectors $EQ_1$–$EQ_4$ have their other drain/sources connected to a reference voltage, or ground in the illustrated embodiment, and their gates connected to associated test points or terminals $TP_1$–$TP_4$, respectively.

With the structure shown in FIG. 11a, when the selection signal is supplied to the probe line $P_i$, the selector $SQ_1$ connected to the probe line $P_i$ is turned on so that the common connecting node and thus one drain/source of each of the four detectors $EQ_1$–$EQ_4$ is connected to the sense line $S_j$. Under the condition, depending on a particular combination of binary data "0" and "1" appearing at the four test points or terminals $TP_1$–$TP_4$, a multilevel signal having a corresponding one of sixteen possible voltage levels $V_0$–$V_F$ is produced on the sense line $S_j$. It is to be noted that as is the case with other embodiments of the present invention, in the case where two or more different combinations of binary data are allowed to have the same voltage level, the possible voltage levels which the multilevel signal can take in the four test point embodiment may be less than sixteen depending on the particular configurations (W/L values) set in the detectors $EQ_1$–$EQ_4$. For example, if desired, two or more detectors EQ may be so structured to have the same configuration (W/L value). In the preferred embodiment, however, detectors $EQ_1$–$EQ_4$ are structured to have different configurations (W/L values) so as to provide sixteen different voltage levels $V_0$–$V_F$.

FIG. 11b illustrates another modified structure for producing a multilevel signal having one of sixteen possible voltage levels. In this structure, electronic switch device $DA_{ij}$ includes four detectors $EQ_1$–$EQ_4$, each comprised of a MOSFET having its one source/drain connected to the probe line $P_i$, its other source/drain connected to the sense line $S_j$ and its gate connected to a corresponding one of four test points or terminals $TP_1$–$TP_4$. In addition, there is also provided a single selector $SQ_0$ which is comprised of a MOSFET having its one source/drain connected to the probe line $P_i$, its other source/drain connected to a reference voltage, or ground in the illustrated embodiment, and its gate connected to receive a selection signal, which can be either "0" or "1."

With this structure also, a multilevel signal having one of the maximum of sixteen possible voltage levels can be produced on the sense line $S_j$. For example, if desired, the detector MOSFETs $EQ_1$–$EQ_4$ may be so structured to have the same configuration (W/L), in which case the number of different voltage levels is less than the maximum number of sixteen. In the preferred embodiment, however, the detector MOSFETs $EQ_1$–$EQ_4$ are so structured to have different configurations (W/L values) so as to provide a multilevel signal which can take any one of sixteen different voltage levels $V_0$–$V_F$ as shown in FIG. 10.

In addition to the above-described modifications, additional modifications are possible by providing one or more resistors in the structure for producing a multilevel signal as described with respect to FIGS. 5a, 5c and 5e. However, in the present embodiment of producing a multilevel signal having one of sixteen different voltage levels, if the detector MOSFETs EQ and also selector MOSFETs SQ, if any, are structured to have the same configuration (W/L), then at least three resistors must be provided to provide four current paths having differing resistances.

With the above-described various modifications and alternatives of a 4-test point structure, a multilevel signal having one of the maximum of sixteen possible different voltage levels can be produced on the sense line $S_j$ depending on a particular combination of binary data supplied to the four test points or terminals $TP_1$–$TP_4$. This structure is particularly advantageous in view of layout because a probe line P and a sense line S normally intersect at right angles so that four quadrants are defined around the intersection, whereby a detector MOSFET EQ and its associated test point or terminal TP may be located in one of these four quadrants. Accordingly, the elements of an electronic switch device DA, such as detector MOSFETs EQ, can be arranged most conveniently and with ease. However, if desired, the present apparatus may also be so structured that five or more test points or terminals TP are associated with a corresponding intersection between probe lines $P_i$ and sense lines $S_j$.

As described above, in an apparatus for testing a semiconductor integrated circuit IC in accordance with the present invention, in the case where test points TP in integrated circuit IC are arranged in the form of a matrix having X rows and Y columns, the number of probe lines P and sense lines S can be reduced to X/p and Y/q, respectively, by arranging test points TP corresponding to each intersection in the matrix of "p" rows and "q" columns. Thus, a decrease in integration density of integrated circuit IC due to the provision of a large number of probe lines P and sense lines S can be avoided, and, therefore, the present testing apparatus is more practical and economical than the prior art.

Figure 12:
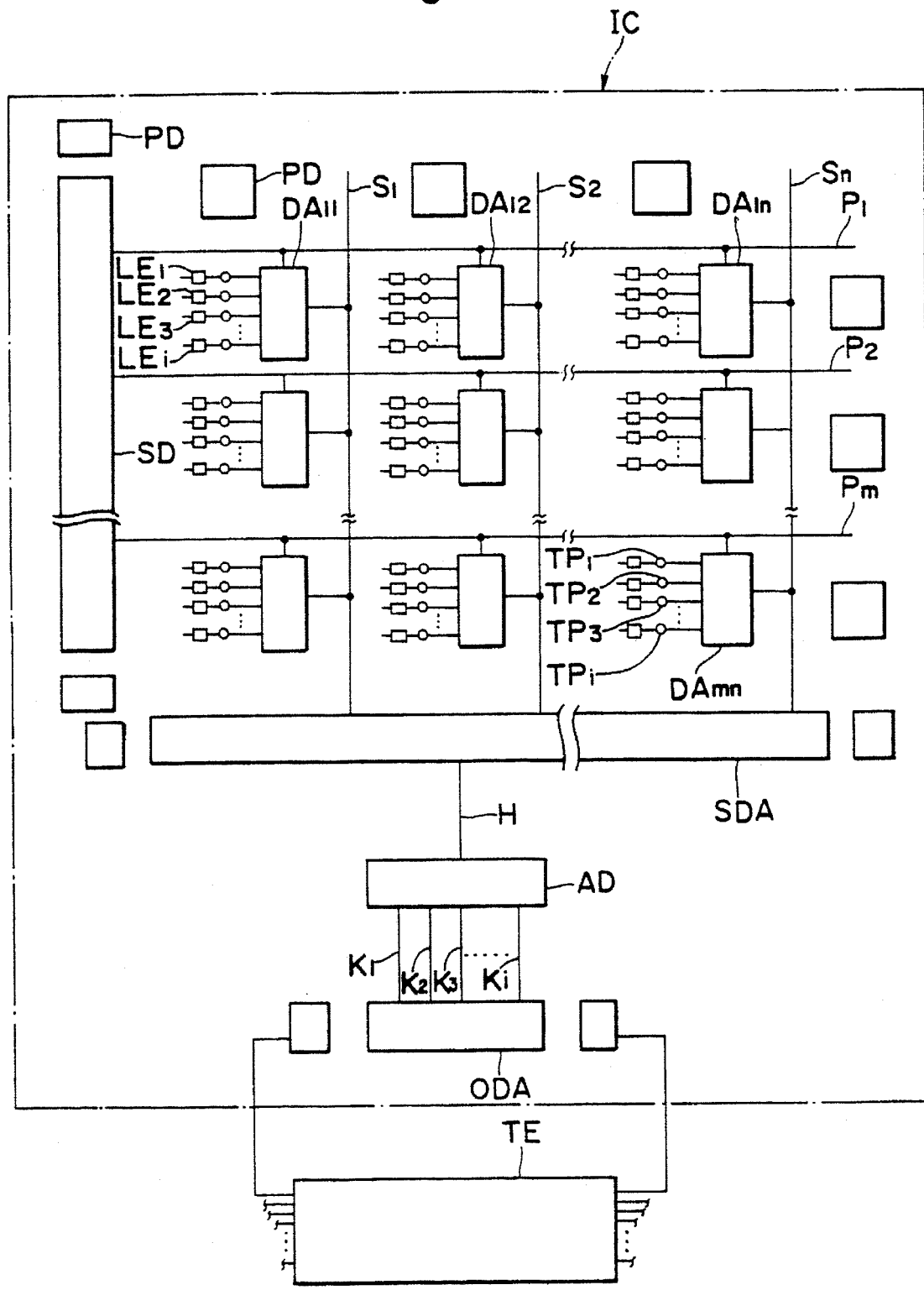
FIG. 12 is a schematic illustration showing a testing apparatus constructed in accordance with a still further embodiment of the present invention using a single common analog-to-digital converter for each of the plurality of sense lines.

FIG. 12 illustrates a semiconductor testing apparatus constructed in accordance with a still further embodiment of the present invention, a single analog-to-digital converting device AD is provided in common with the sense lines S. A selection device SDA including analog switches is connected to sense lines S incorporated in an integrated circuit IC. The analog-to-digital converting device AD is connected to the selection device SDA through line H, and "also connected to an observation device ODA through output lines $L_1 L_i$, of which the number of lines is the same as that of test points TP connected to electronic switch device DA.

Multilevel signals supplied to sense lines S by applying a selection signal in sequence to probe lines P from a selection device SD are supplied to the analog-to-digital converting device AD through the selection device SDA in sequence by each sense line S, then the multilevel signals are converted into binary data which are the same as the original binary data by the analog-to-digital converting device AD, and the binary data thus converted are supplied to the observation device ODA through output lines $K_1$–$K_i$.

According to this embodiment, the analog-to-digital converting device AD and the observation device ODA can be reduced in size, and the number of lines for connecting the analog-to-digital converting device AD and the observation device can be reduced. Besides, it is possible to carry out tests more rapidly by providing selection device SDA with functions for combining two or more of the multilevel signals on sense lines S.

Furthermore, P-channel MOSFETs can be used for electronic switches EQ and selection switches SQ as can bipolar transistors, Josephson devices, and GaAs devices, as in the case of any other embodiment of the present invention as described in the present specification.

Figure 13:
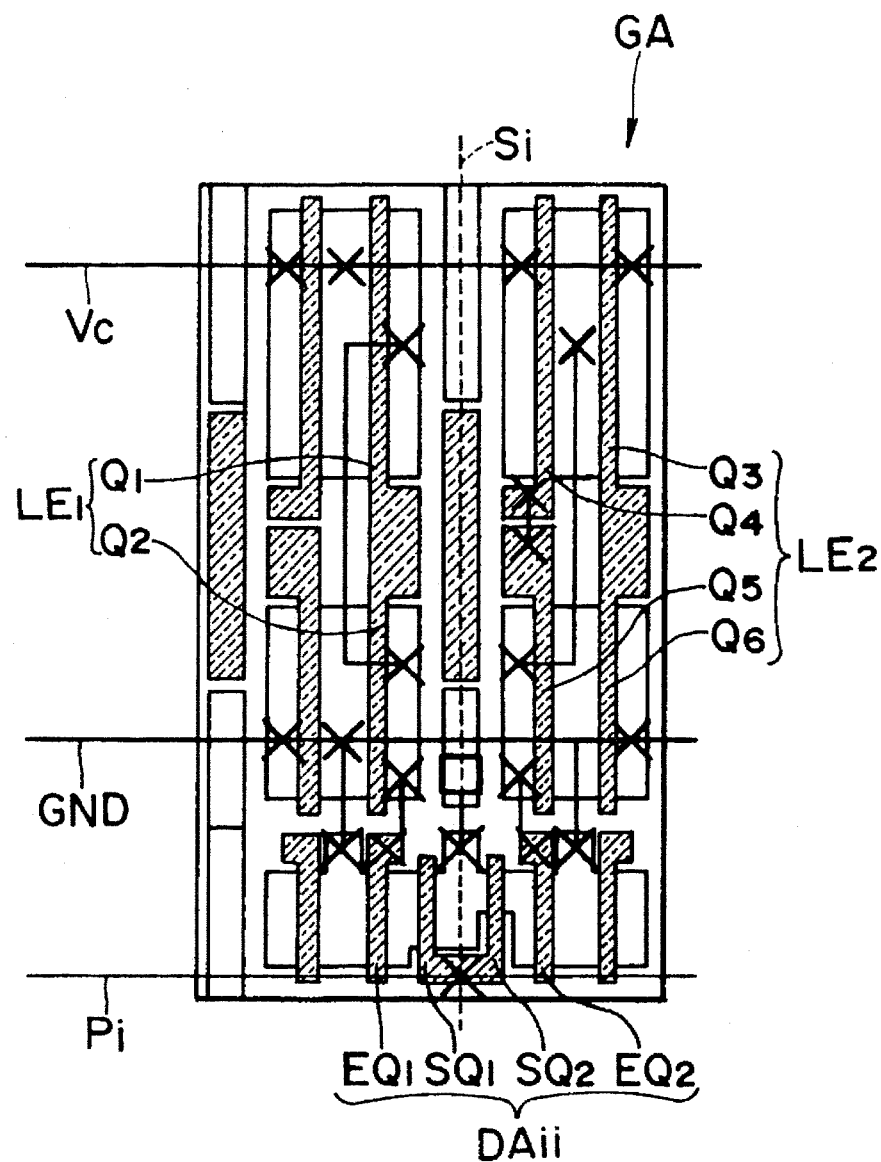
FIG. 13 is a schematic illustration showing a testing apparatus of the present invention when constructed using a gate array.
Figure 14:
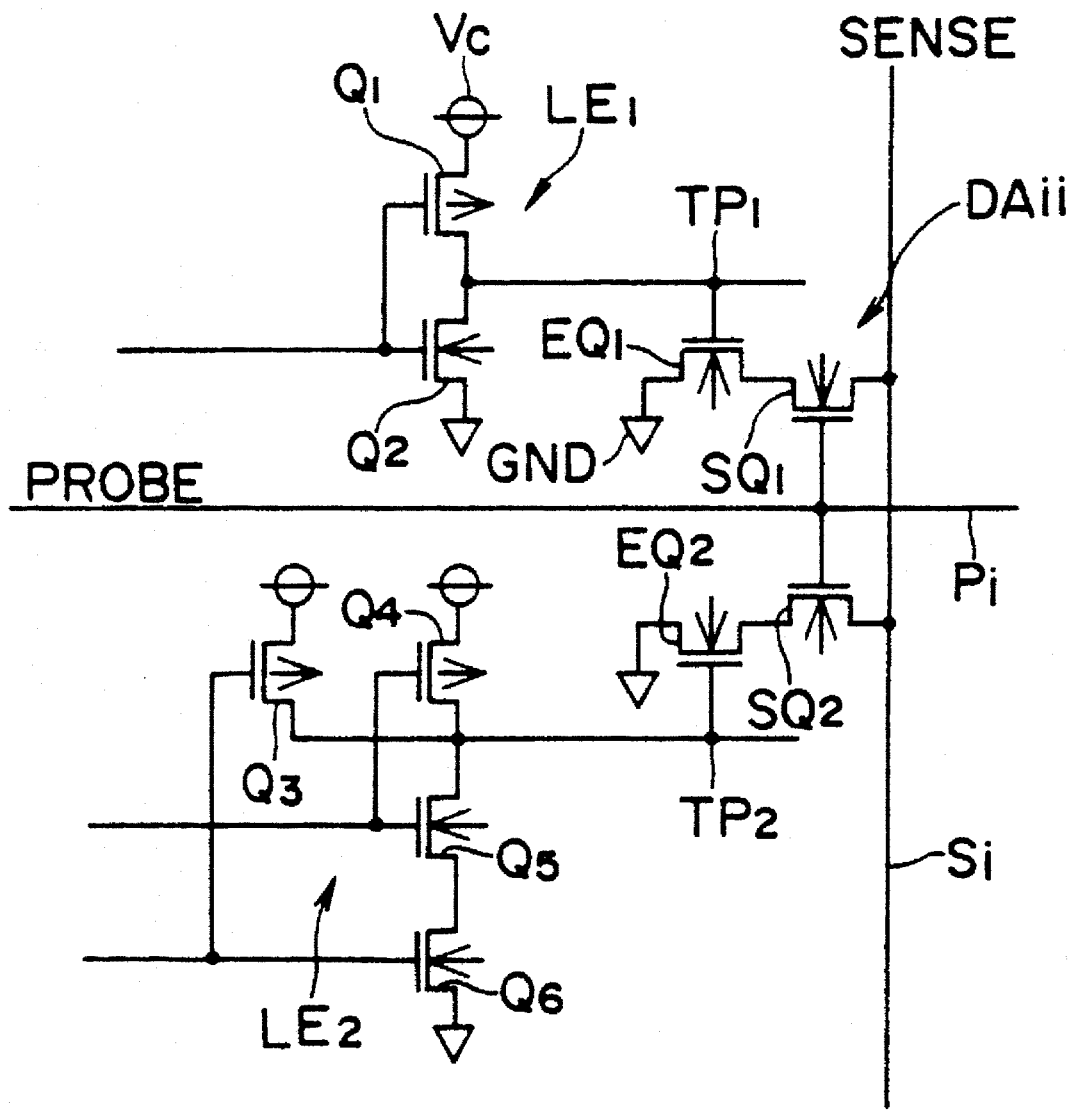
FIG. 14 is a circuit equivalent to the structure shown in FIG. 13.

FIG. 13 illustrates an embodiment when the present invention is embodied in the form of a gate array GA. FIG. 14 illustrates an equivalent circuit diagram of the structure shown in FIG. 13. As shown in FIG. 13, a probe line $P_i$, a ground GND line and a power supply source line $V_c$ extend horizontally and in parallel as defined by a metal 1 layer. A sense line $S_i$ extends vertically crossing the power supply source $V_c$, ground GND and probe $P_i$ lines and the sense line $S_i$ is defined by a metal 2 layer. Also provided in the gate array GA are an electronic switch device $DA_{ij}$, including a pair of selector switches SQ and a pair of detector switches EQ, a first logic element $LE_1$ comprised of two MOSFETs $Q_1$ and $Q_2$ to be tested and a second logic element $LE_2$ comprised of four MOSFETs $Q_3$–$Q_6$ to be tested. A first vertical connection indicated by "X" is a contact between a metal and a polysilicon or diffusion region, and a second vertical connection indicated by a square is a metal-to-metal via.

As shown in the form of an equivalent circuit diagram in FIG. 14, the first logic element $LE_1$ is defined as an inverter comprised of a P-channel MOSFET $Q_1$ and an N-channel MOSFET $Q_2$, whereas, the second logic element $LE_2$ is defined as an NAND gate comprised of P-channel MOSFETs $Q_3$ and $Q_4$ and N-channel MOSFETs $Q_5$ and $Q_6$. The first logic element (inverter) $LE_1$ has its output coupled to a first test point $TP_1$ which in turn is connected to the gate of first detector MOSFET $EQ_1$, which, in turn, has its one source/drain connected to a reference voltage, or ground in the illustrated embodiment, and its other source/drain connected to one source/drain of a first selector $SQ_1$ which has its other source/drain connected to the sense line $S_i$ and its gate connected to the probe line $P_i$.

On the other hand, the second logic element (NAND gate) $LE_2$ has its output coupled to a second test point or terminal $TP_2$ which is connected to the gate of a second detector MOSFET $EQ_2$, which, in turn, has its one source/drain connected to a reference voltage, or ground in the illustrated embodiment, and its other source/drain connected to one source/drain of second selector MOSFET $SQ_2$ having its other source/drain connected to the sense line $S_i$ and its gate connected to the probe line $P_i$.

It is thus clear that the gate array structure shown in FIG. 13 provides a two-test point embodiment of the present invention as described above. Another gate array structure providing a four-test point embodiment may be constructed by providing a mirror image structure with respect to the bottom line shown in FIG. 13. It is therefore clear that the four-test point embodiment is most preferable when a gate array structure is used in its implementation because of its efficient layout.

As described above, in some embodiments, electronic switches EQ have the same W/L value and selection switches SQ have different W/L values from each other. Alternatively, in other embodiments, electronic switches EQ may have different W/L values and selection switches SQ may have the same W/L value. As a further alternative, both of electronic switches EQ and selection switches SQ may have different W/L values one from another. In addition, it is possible to observe multilevel signals produced on sense lines S or to apply a selection signal to probe lines P using a laser beam or electron beam. Moreover, the present testing apparatus can be used for testing various custom-made semiconductor integrated circuits.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. An apparatus for testing a semiconductor integrated circuit, comprising:

a plurality of probe lines incorporated in said integrated circuit;

a plurality of sense lines also incorporated in said integrated circuit such that at least some of said sense lines intersect at least some of said plurality of probe lines as electrically separated therefrom to thereby define a plurality of intersections between said probe and sense lines; and means for producing a multilevel signal, having a level corresponding to a combination of digital outputs from logic elements to be tested in said integrated circuit, on an associated one of said plurality of sense lines, said means for producing a multilevel signal being provided one for each of selected ones of said plurality of intersections and including at least two test points each operatively coupled to a corresponding one of said logic elements to be tested in said integrated circuit, said means for producing a multilevel signal producing a multilevel signal having one of a predetermined number of multilevels, which uniquely correspond to one of a plurality of combinations defined by at least two binary numbers output by said logic elements at said at least two test points.

2. The apparatus of claim 1, wherein said means for producing a multilevel signal includes at least two detector switches and means for establishing an electrical connection between said associated sense line and a reference potential through a corresponding one of said at least two detector switches.

3. The apparatus of claim 2, wherein said means for establishing an electrical connection includes at least one selector switch.

4. The apparatus of claim 3, wherein said at least two detector switches include at least two detector MOSFETs, each of which has a gate connected to a corresponding one of said test points, a first source/drain connected to said reference potential and a second source/drain.

5. The apparatus of claim 4, wherein said at least one selector switch includes at least one selector MOSFET having a gate connected to a corresponding one of said plurality of probe lines, a first source/drain connected to said second source/drain of at least one of said detector MOSFETs and a second source/drain connected to said associated sense line.

6. The apparatus of claim 2, wherein said means for producing a multilevel signal further includes at least one resistor in series with one of said at least two detector switches.

7. The apparatus of claim 6, wherein said means for producing a multilevel signal includes at least two resistors, each of which is in series with a corresponding one of said at least two detector switches.

8. The apparatus of claim 3, wherein said at least two detector switches include at least two detector MOSFETs, each of which has a gate connected to a corresponding one of said test points, a first source/drain connected to an associated probe line and a second source/drain connected to an associated sense line.

9. The apparatus of claim 8, wherein said at least one selector switch includes at least one selector MOSFET having a gate connected to receive a selection signal, a first source/drain connected to said associated probe line and a second source/drain connected to said associated sense line.

10. The apparatus of claim 1, further comprising first selecting means for selecting one of said plurality of probe lines during test operation in accordance with a selected test program.

11. The apparatus of claim 10, wherein said first selecting means includes a plurality of flipflops connected in series and each of said plurality of flipflops has an output operatively coupled to a corresponding one of said plurality of probe lines so that said plurality of probe lines are selected in sequence as said selection signal propagates through said series of flipflops.

12. The apparatus of claim 1, further comprising second selecting means for selecting one of said plurality of sense lines during test operation in accordance with a selected test program.

13. The apparatus of claim 1, further comprising converting means for converting said multilevel signal into a corresponding digital signal in binary representation.

14. An apparatus for testing a semiconductor integrated circuit, comprising:

a plurality of probe lines incorporated in said integrated circuit;

a plurality of sense lines also incorporated in said integrated circuit such that at least some of said sense lines intersect at least some of said plurality of probe lines as electrically isolated therefrom to thereby define a plurality of intersections between said probe and sense lines; and means for producing a multilevel signal, having a level corresponding to a combination of digital outputs from logic elements to be tested in said integrated circuit, on an associated one of said plurality of sense lines, said means for producing a multilevel signal being provided one for each of selected ones of said plurality of intersections and including four test points each operatively coupled to a corresponding one of said logic elements to be tested, said means for producing a multilevel signal producing a multilevel signal having one of a predetermined number of multilevels, which uniquely corresponds to one of a plurality of combinations defined by four binary numbers output by said logic elements at said four test points.

15. The apparatus of claim 14, wherein said plurality of probe lines extend generally in a first direction and said plurality of sense lines extend generally in a second direction which is normal to said first direction so that four quadrants are defined around each of said intersections between said probe and sense lines, whereby each of said four test points associated with a corresponding one of said plurality of intersections is located in a corresponding one of said four associated quadrants.

16. The apparatus of claim 15, wherein said means for producing a multilevel signal includes four detector switches, each located in a corresponding one of said four quadrants, and means for establishing an electrical connection between said associated sense line and a reference potential.

17. The apparatus of claim 16, wherein each of said detector switches includes a detector MOSFET having a gate connected to a corresponding test point, a first source/drain connected to said reference potential and a second source/drain connected to said means for establishing.

18. The apparatus of claim 17, wherein said means for establishing includes a selector MOSFET having a gate connected to an associated probe line, a first source/drain connected to said second source/drain of said detector MOSFET and a second source/drain connected to an associated sense line.

19. The apparatus of claim 16, wherein each of said detector switches includes a detector MOSFET having a gate connected to a corresponding test point, a first source/drain connected to an associated sense line and a second source/drain connected to an associated probe line, and said means for establishing includes a selector MOSFET having a gate connected to receive a selection signal, a first source/drain connected to said associated probe line and a second source/drain connected to said reference potential.

20. The apparatus of claim 1, wherein said apparatus is in the form of a gate array.

21. The apparatus of claim 14, wherein said apparatus is in the form of a gate array.

* * * * *